(12) United States Patent  
Zhang et al.

(10) Patent No.: US 12,183,585 B2
(45) Date of Patent: Dec. 31, 2024

(54) MANUFACTURING METHOD OF SEMICONDUCTOR STRUCTURE INCLUDING COMPLEMENTARY FIRST AND SECOND MASK PATTERNS

(71) Applicant: CHANGXIN MEMORY TECHNOLOGIES, INC., Hefei (CN)

(72) Inventors: Kui Zhang, Hefei (CN); Zhan Ying, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 632 days.

(21) Appl. No.: 17/476,772

(22) Filed: Sep. 16, 2021

(65) Prior Publication Data

US 2022/0093408 A1 Mar. 24, 2022

Related U.S. Application Data

(63) Continuation of application No. PCT/CN2021/101617, filed on Jun. 22, 2021.

(30) Foreign Application Priority Data

Sep. 18, 2020 (CN) .......................... 202010988676.1

(51) Int. Cl.
*H01L 21/308* (2006.01)
*H01L 21/3213* (2006.01)
(Continued)

(52) U.S. Cl.
CPC .... *H01L 21/3086* (2013.01); *H01L 21/32139* (2013.01); *H10B 12/482* (2023.02); *H10B 12/485* (2023.02); *H01L 21/0272* (2013.01)

(58) Field of Classification Search
CPC ........... H01L 21/3086; H01L 21/32139; H01L 21/0272; H01L 21/31144; H10B 12/482; H10B 12/485
See application file for complete search history.

(56) References Cited

U.S. PATENT DOCUMENTS 6,852,620 B2   2/2005   Kim
7,045,875 B2   5/2006   Kim
(Continued)

FOREIGN PATENT DOCUMENTS

CN    1474436 A      2/2004
CN    101308812 A    11/2008
(Continued)

OTHER PUBLICATIONS

International Search Report in the international application No. PCT/CN2021/101617, mailed on Sep. 28, 2021, 5 pages.
(Continued)

*Primary Examiner* — Benjamin P Sandvik
*Assistant Examiner* — John Patrick Cornely
(74) *Attorney, Agent, or Firm* — Kilpatrick Townsend & Stockton LLP

(57) ABSTRACT

Provided is a manufacturing method of a semiconductor structure, including: providing a substrate; forming a first mask layer having a first mask pattern on the substrate, and etching the substrate by using the first mask layer as a mask to form active regions; forming several discrete bitlines on the active regions; forming a sacrificial layer between adjacent bitlines; forming a second mask layer having a second mask pattern on the sacrificial layer, the first mask pattern and the second mask pattern being complementary to each other; and etching the sacrificial layer by using the second mask layer and the bitlines as masks to form a plurality of contact structures. The embodiment of the present disclosure is beneficial to reducing the manufacturing cost of the semiconductor structure.

15 Claims, 14 Drawing Sheets

(51) Int. Cl.
*H10B 12/00* (2023.01)
*H01L 21/027* (2006.01)

(56) References Cited

U.S. PATENT DOCUMENTS

| | | |
|---|---|---|
| 7,799,643 B2 | 9/2010 | Kang |
| 7,846,825 B2 | 12/2010 | Kang et al. |
| 8,129,244 B2 | 3/2012 | Eun |
| 8,163,646 B2 | 4/2012 | Kang |
| 8,723,289 B2 | 5/2014 | Kang |
| 9,634,012 B2 | 4/2017 | Park et al. |
| 9,659,940 B2 | 5/2017 | Park et al. |
| 10,566,333 B2 | 2/2020 | Lee |
| 10,748,908 B2 | 8/2020 | Lee |
| 2004/0016964 A1 | 1/2004 | Kim |
| 2005/0098850 A1 | 5/2005 | Kim |
| 2008/0283957 A1 | 11/2008 | Kang |
| 2010/0327407 A1 | 12/2010 | Kang |
| 2011/0129974 A1 | 6/2011 | Eun |
| 2012/0175692 A1 | 7/2012 | Kang |
| 2015/0014759 A1 | 1/2015 | Lee et al. |
| 2017/0005099 A1 | 1/2017 | Lee et al. |
| 2019/0279988 A1 | 9/2019 | Lee et al. |

FOREIGN PATENT DOCUMENTS

| | | |
|---|---|---|
| CN | 101937877 A | 1/2011 |
| CN | 102082095 A | 6/2011 |
| CN | 106941097 A | 7/2017 |
| CN | 109148376 A | 1/2019 |
| CN | 111640705 A | 9/2020 |

OTHER PUBLICATIONS

Written Opinion cited in PCT/CN2021/101617, mailed on Sep. 28, 2021, 6 pages.

Written Opinion cited in PCT/CN2021/112303, mailed on Nov. 17, 2021, 7 pages.

MANUFACTURING METHOD OF SEMICONDUCTOR STRUCTURE INCLUDING COMPLEMENTARY FIRST AND SECOND MASK PATTERNS

CROSS-REFERENCE TO RELATED APPLICATIONS

This application is a continuation application of International Patent Application No.: PCT/CN2021/101617, filed on Jun. 22, 2021, which claims priority to Chinese Patent Application No. 202010988676.1, filed with the Chinese Patent Office on Sep. 18, 2020 and entitled "MANUFACTURING METHOD OF SEMICONDUCTOR STRUCTURE." International Patent Application No.: PCT/CN2021/101617 and Chinese Patent Application No. 202010988676.1 are incorporated herein by reference in their entireties.

TECHNICAL FIELD

Embodiments of the present disclosure relate to the field of semiconductor technologies, and in particular to a manufacturing method of a semiconductor structure.

BACKGROUND

A photomask serves as a master mask made of quartz material and can be applied to a semiconductor exposure process. The manufacturing cost of the photomask includes not only the cost of raw materials such as quartz, but also the use cost of a photomask writer, and the cost of software, server and manual development for detecting relevant data of the photomask, and therefore the preparation cost of the photomask is high.

Manufacturing steps of the semiconductor structure include many processes. In different processes, patterns of mask layers are often different, so photomasks required to prepare the mask layers are also different; the more the number of photomasks required, the higher the manufacturing cost of the semiconductor structure.

SUMMARY

An embodiment of the present disclosure provides a manufacturing method of a semiconductor structure to solve the problem of high manufacturing cost of the semiconductor structure.

According to some embodiments, the embodiments of the present disclosure provide a manufacturing method of a semiconductor structure, including: providing a substrate; forming a first mask layer having a first mask pattern on the substrate, and etching the substrate by using the first mask layer as a mask to form active regions; forming several discrete bitlines on the active regions; forming a sacrificial layer between adjacent bitlines; forming a second mask layer having a second mask pattern on the sacrificial layer, the first mask pattern and the second mask pattern being complementary to each other; and etching the sacrificial layer by using the second mask layer and the bitlines as masks to form a plurality of contact structures.

BRIEF DESCRIPTION OF DRAWINGS

One or more embodiments are illustrated by way of example, and not by limitation, in the figures of the accompanying drawings, where elements having the same reference numeral designations represent like elements throughout. The drawings are not to scale, unless otherwise specified.

DESCRIPTION OF EMBODIMENTS

It can be known from the background section that the manufacturing cost of a semiconductor structure in a prior art is high.

Specifically, in a process of manufacturing a semiconductor structure, a first mask layer required to form active regions is different from a second mask layer required to form contact structures, and there is no correlation between a first mask pattern of the first mask layer and a second mask pattern of the second mask layer. Therefore, a photomask required for preparing the first mask layer is different from a photomask required for preparing the second mask layer. Due to the high manufacturing cost of the photomask, the manufacturing cost of a semiconductor structure prepared on the basis of the photomask is also high.

An embodiment of the present disclosure provides a manufacturing cost method of a semiconductor structure. By using a first mask layer having a first mask pattern as a mask, a substrate is etched to form active regions, and by using a second mask layer having a second mask pattern and a cap layer of bitlines as masks, a sacrificial layer is etched to form contact structures. The first mask pattern and the second mask pattern are complementary to each other. The same photomask can be used to prepare the first mask layer and the second mask layer, that is, a photomask for forming the active region and a photomask for forming the contact structure are the same. Therefore, the manufacturing cost of the semiconductor structure can be reduced by reducing the number of photomasks prepared.

In order to make the objectives, technical solutions, and advantages of the embodiments of the present disclosure more clear, various embodiments of the present disclosures will be detailed below in combination with the accompanying drawings. However, a person of ordinary skill in the art can understand that in each embodiment of the present disclosure, many technical details are provided for readers to better understand the present disclosure. However, even if these technical details are not provided and based on variations and modifications of the following embodiments, the technical solutions sought for protection in the present disclosure can also be implemented.

The manufacturing method of a semiconductor structure according to this embodiment will be described in detail below with conjunction with the accompanying drawings.

Figure 1:
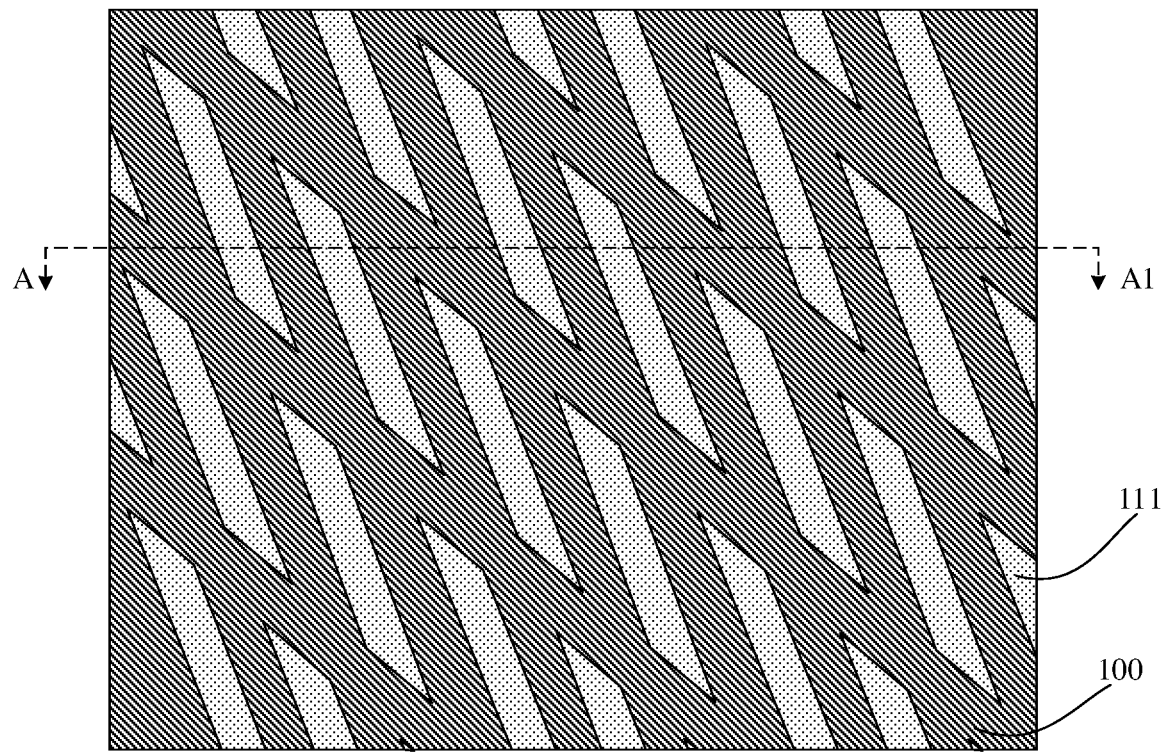
FIG. 1 is a schematic structural top view of a first mask layer according to an embodiment of the present disclosure.
Figure 2:
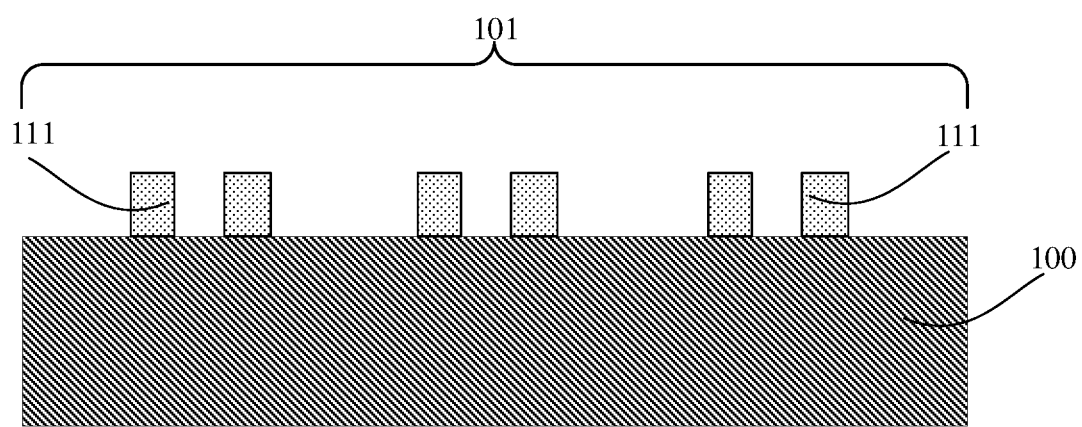
FIG. 2 is a schematic structural cross-sectional diagram of a first mask layer according to an embodiment of the present disclosure.
Figure 3:
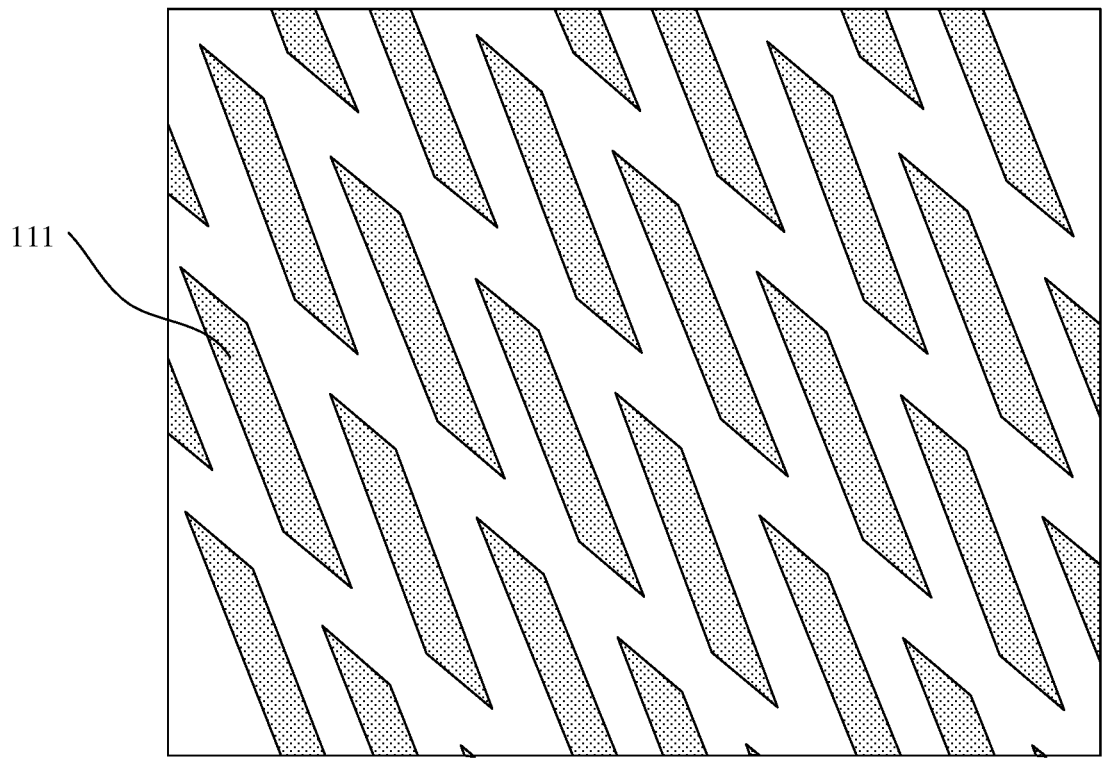
FIG. 3 is a schematic structural top view of a first mask pattern according to an embodiment of the present disclosure.

Referring to FIGS. 1 and 3, FIG. 1 is a schematic structural top view of a first mask layer; FIG. 2 is a schematic structural cross-sectional diagram along direction AA1; and FIG. 3 is a schematic structural top view of a first mask pattern. A substrate 100 is provided, and a first mask layer 101 having a first mask pattern 111 is formed on the substrate 100.

In this embodiment, the substrate 100 is configured as a silicon substrate. In other embodiments, the substrate may also be configured as a semiconductor substrate such as a germanium substrate, a silicon germanium substrate, a silicon carbide substrate, or a silicon on insulator substrate.

The first mask pattern 111 is configured to define the pattern and position of subsequently formed active regions. Specifically, in this embodiment, the first mask pattern 111 includes an elongated pattern, the first mask layer 101 has a plurality of elongated patterns, and the plurality of elongated patterns are arranged in an array. In a subsequent process step of forming the active region, the substrate 100 right below the elongated pattern is not etched, while the substrate 100 right below a region between the adjacent elongated patterns is etched, thereby forming a plurality of active regions.

In this embodiment, the first mask layer 101 is of a single-layer structure, and a material of the first mask layer 101 may be a hard mask material such as silicon oxide, silicon nitride, or titanium nitride. In other embodiments, the first mask layer may also be of a laminated structure.

In this embodiment, a first photomask and a second photomask are used to form the first mask pattern. The step of forming the first mask pattern will be described in detail below in conjunction with the drawings.

FIGS. 4 to 11 are schematic structural diagrams corresponding to various steps of forming the first mask pattern by using the first photomask and the second photomask according to this embodiment.

Figure 4:
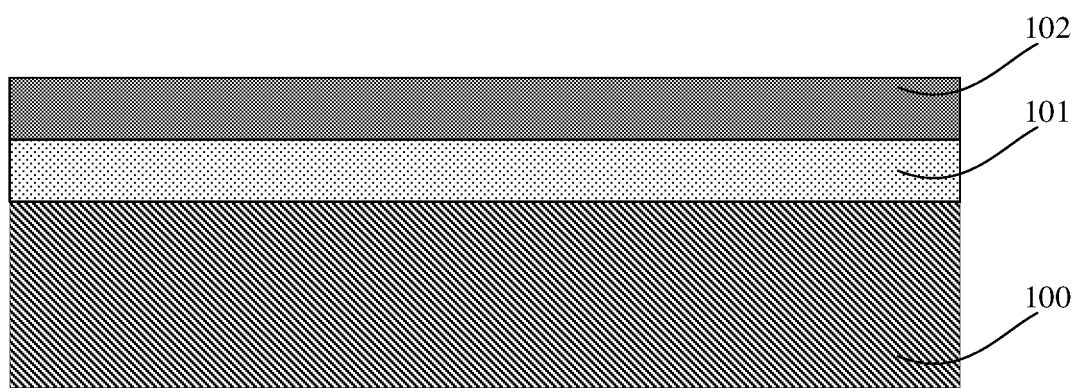
FIGS. 4 and 11 are schematic structural top views corresponding to various steps of forming a first mask pattern by using a first photomask and a second photomask according to an embodiment of the present disclosure.

Referring to FIG. 4, an unpatterned first mask layer 101 is formed on the substrate 100.

Specifically, the first mask layer 101 is located on the substrate 100 and is configured to provide a process basis for subsequent formation of a patterned first mask layer. In this embodiment, the first mask layer 101 is of a single-layer structure.

In order to improve the accuracy of pattern transfer, in this embodiment, a fourth mask layer 102 may also be formed on the unpatterned first mask layer 101, and a material of the fourth mask layer 102 is different that of the first mask layer 101.

In the subsequent pattern transfer process, there is a high etch selectivity between a subsequently formed first photo-resist line and the fourth mask layer 102, there is a high etch selectivity between the fourth mask layer 102 and the first mask layer 101, and there is a high etch selectivity between the first mask layer 101 and the substrate 100, thereby improving the accuracy of a pattern transferred to the active region formed in the substrate 100 from the subsequently formed first photoresist line.

Figure 5:
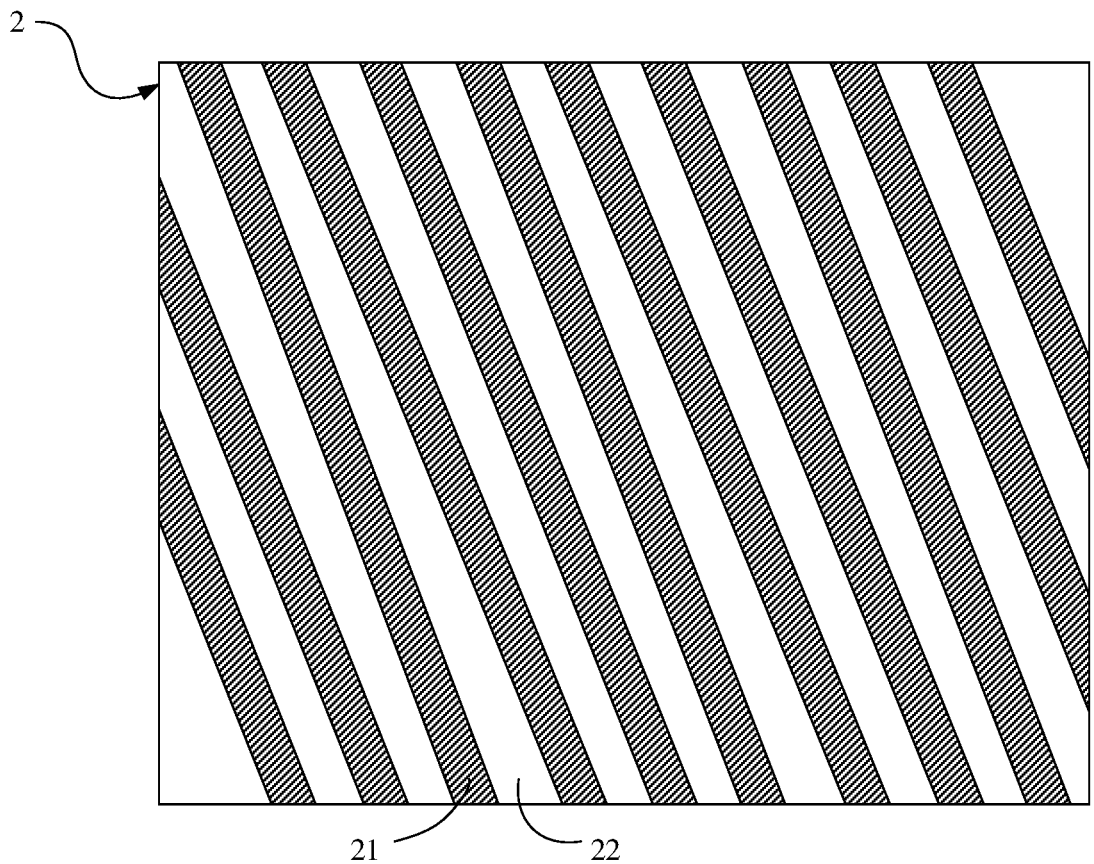
Figure 6:
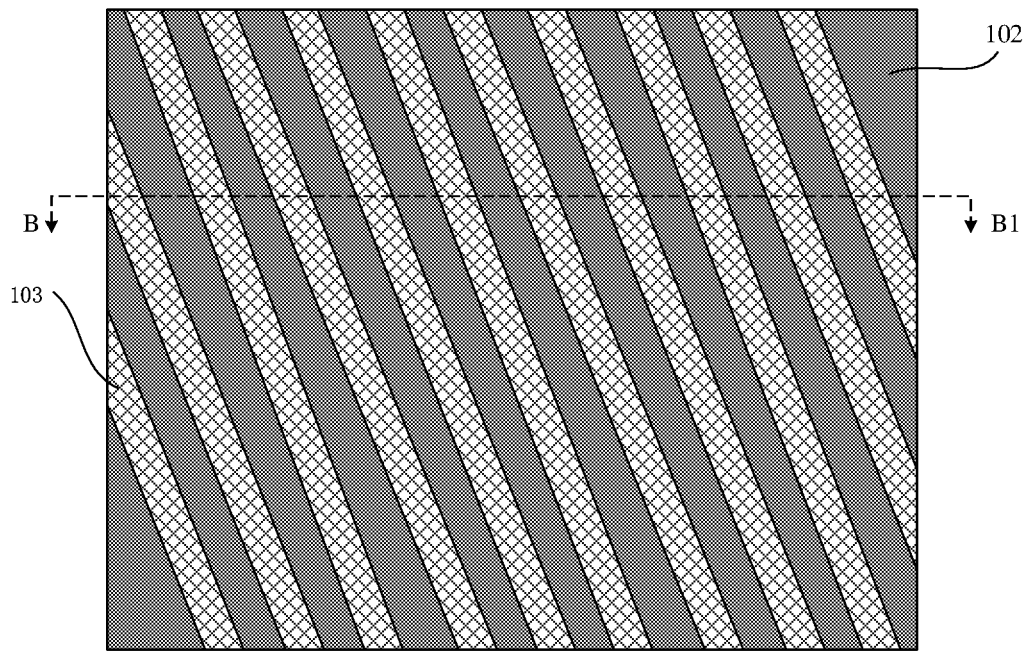

Referring to FIGS. 5 and 6, FIG. 5 is a schematic structural top view of a first photomask, and FIG. 6 is a schematic structural top view of a fourth mask layer with first photoresist lines. A first photomask 2 is provided, and the first photomask 2 is configured to form first photoresist lines 103 extending in a first direction on the first mask layer 101.

The first photomask 2 has a first light-shielding region 21 and a first transparent region 22. Positions of the first light-shielding region 21 and the first transparent region 22 are related to the nature of a photoresist of the first photoresist line 103. Specifically, if the first photoresist line 103 is made of a positive photoresist, the position of the first light-shielding region 21 corresponds to the positions of the first photoresist line 103, and the first transparent region 22 is configured to define positions of adjacent first photoresist lines. In other embodiments, if the first photoresist line is made of a negative photoresist, the position of the first transparent region corresponds to the position of the first photoresist line, and the first light-shielding region is configured to define the positions of the adjacent first photoresist lines.

In this embodiment, taking the first photoresist line 103 made of a positive photoresist as an example, the process step of forming the first photoresist line 103 includes: forming a photoresist film on the first mask layer 101; exposing the photoresist film by using the first photomask 2, the photoresist film having an exposed region and a non-exposed region, the exposed region being opposite to the first transparent region 22, the non-exposed region being opposite to the first light-shielding region 21, a material nature of the photoresist film in the exposed region being changed during the exposure process; and after the exposure process, carrying out development process to remove the photoresist film in the exposed region to form the first photoresist line 103.

It can be understood that, in other embodiments, the first photoresist line may also be made of a negative photoresist.

Figure 7:
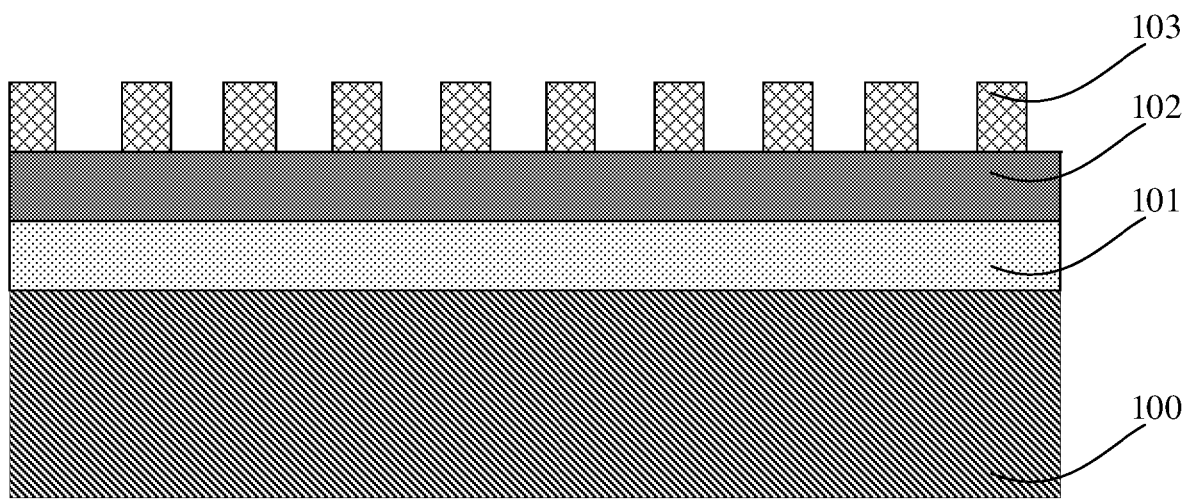
Figure 8:
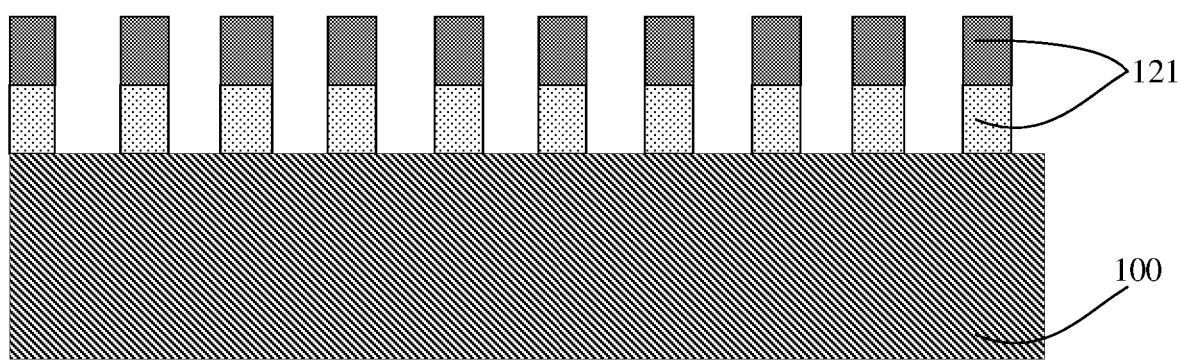

Referring FIGS. 7 and 8, FIG. 7 is a schematic structural cross-sectional diagram of FIG. 6 along direction BB1, and FIG. 8 is a schematic structural cross-sectional diagram of a substrate with first mask lines. The first mask layer 101 is etched by using the first photoresist lines 103 to form first mask lines 121.

In this embodiment, since the fourth mask layer 102 is further formed between the first photoresist line 103 and the first mask layer 101, the fourth mask layer 102 is first etched by using the first photoresist line 103 to transfer the pattern from the first photoresist line 103 to the fourth mask layer 102, and then the first mask layer 101 is etched by using the fourth mask layer 102 to form the first mask line 121.

Since there is a high etch selectivity between the first photoresist line 103 and the fourth mask layer 102 and between the fourth mask layer 102 and the first mask layer 101, the pattern accuracy of the formed first mask line 121 is high, which is beneficial to improving the pattern consistency between the first mask line 121 and the first photoresist line 103.

In this embodiment, both the fourth mask layer 102 and the first mask layer 101 can be etched by dry etching to form the first mask line 121.

Figure 9:
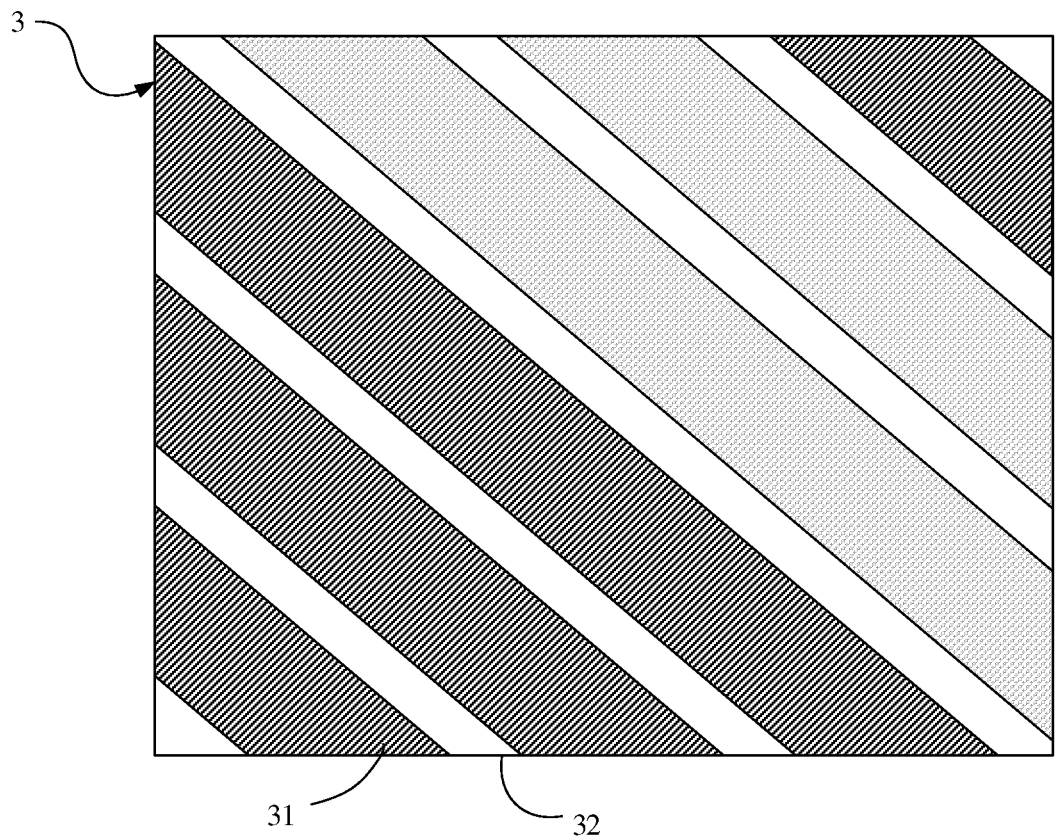
Figure 10:
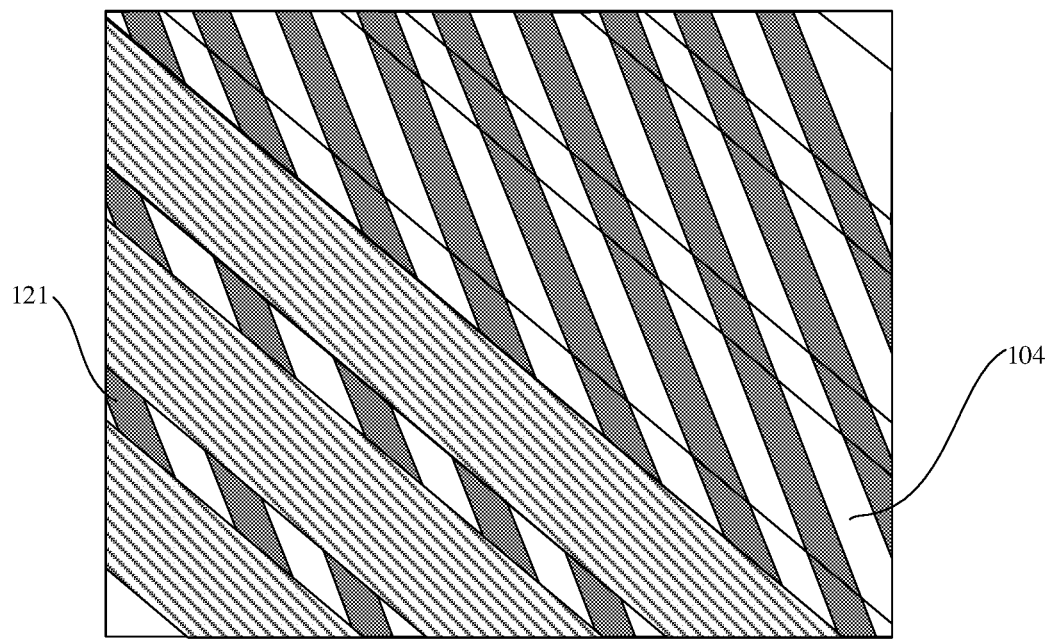

Referring to FIGS. 9 and 10, FIG. 9 is a schematic structural top view of a second photomask, and FIG. 10 is a schematic structural top view of first mask lines with second photoresist lines. A second photomask 3 is provided, and the second photomask 3 is configured to form second photoresist lines 104 extending in a second direction on the first mask lines 121.

The second photomask 3 has a second light-shielding region 31 and a second transparent region 32. The positions of the second light-shielding region 31 and the second transparent region 32 are related to the nature of a photoresist of the second photoresist line 104. Specifically, if the second photoresist line 104 is made of a positive photoresist, the position of the second light-shielding region 31 corresponds to the position of the second photoresist line 104, and the second transparent region 32 is configured to define positions of adjacent second photoresist lines 104. In other embodiments, if the second photoresist line is made of a negative photoresist, the position of the second transparent region corresponds to the position of the second photoresist line, and the second light-shielding region is configured to define the positions of the adjacent second photoresist lines.

In this embodiment, taking the second photoresist line 104 made of a positive photoresist as an example, the process step of forming the second photoresist line 104 includes: forming a photoresist film on the first mask lines 121 and in a space between adjacent first photoresist lines 103; exposing the photoresist film by using the second photomask 3, the photoresist film having an exposed region and a non-exposed region, the exposed region being opposite to the second transparent region 32, the non-exposed region being opposite to the second light-shielding region 31, the material nature of the photoresist film in the exposed region being changed during the exposure process; and after the exposure process, carrying out development process to remove the photoresist film in the exposed region to form the second photoresist line 104.

It can be understood that, in other embodiments, the second photoresist line may also be made of a negative photoresist.

Referring to FIG. 10 and FIG. 3, the first mask lines 121 are etched using by the second photoresist lines 104 to form elongated patterns.

In this embodiment, the process step of forming the elongated patterns includes: etching the fourth mask layer 102 (see FIG. 8) in the space between the adjacent second photoresist lines 104 by using the second photoresist lines 104; then, etching the first mask layer 101 (see FIG. 8) by using the remaining fourth mask layer 102 as a mask; and removing the second photoresist lines 104 and the remaining fourth mask layer 102 to form the elongated patterns.

Figure 11:
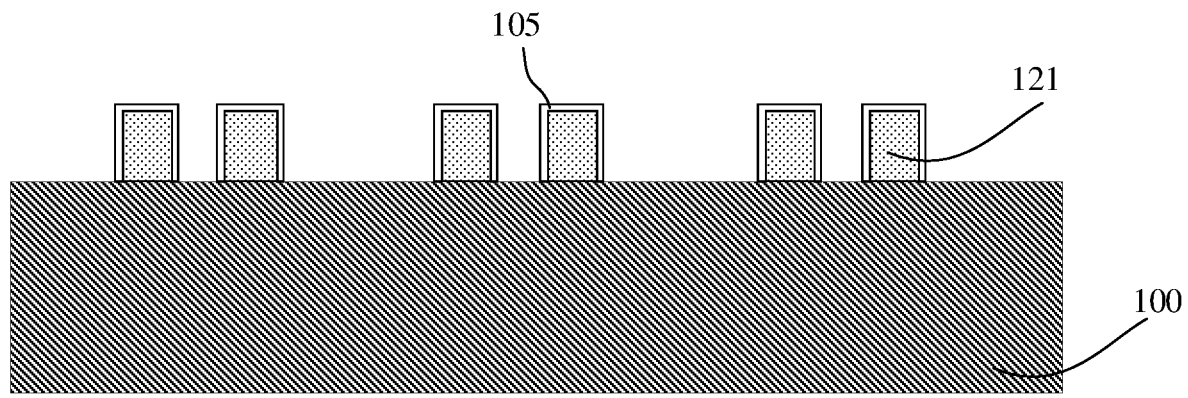

Referring to FIG. 11, FIG. 11 is a schematic structural cross-sectional diagram of elongated patterns having a repair layer on their sidewalls. A repair layer 105 is formed on the sidewalls of the elongated pattern.

In this embodiment, the process step of forming the repair layer 105 includes: forming an initial repair layer on a top of the elongated pattern and in the space between the elongated patterns, the initial repair layer filling up the space between the elongated patterns; and removing part of the initial repair layer and retaining the initial repair layer on the sidewalls and top of the elongated pattern to form the repair layer 105; in this way, when the substrate 100 is subsequently etched by using the first mask layer 101 (see FIG. 2) having the first mask pattern 111 (see FIG. 2) as a mask to form the active region, edges of the active region are relatively rounded. In other embodiments, only the initial repair layer on the sidewalls of the elongated pattern may be retained to form the repair layer.

In this embodiment, there is a high etch selectivity between the repair layer 105 and the substrate 100, so that the first mask pattern 111 having the repair layer 105 can be accurately transferred to the substrate 100. A material of the repair layer 105 includes silicon oxide, and a thickness of the repair layer 105 is within a range of 0.1 nm to 5 nm.

Figure 12:
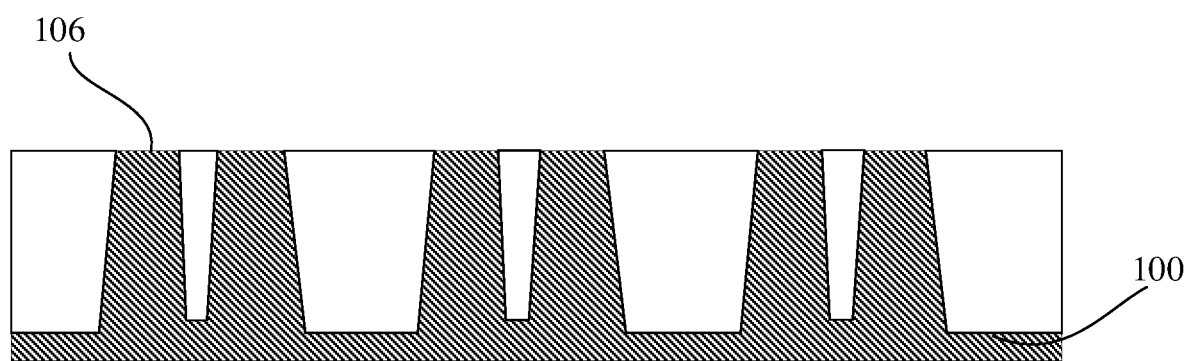
FIG. 12 is a schematic structural cross-sectional diagram of an active region formed by etching a substrate according to an embodiment of the present disclosure.

Referring to FIGS. 11 and 12, the substrate 100 is etched to form active regions 106 by using the first mask layer 101 (see FIG. 2) having the first mask pattern 111 (see FIG. 2) as a mask.

In this embodiment, in the step of forming the active region 106, since the adjacent elongated patterns are staggered, the spacing between the adjacent elongated patterns is not the same. When the spacing between adjacent elongated patterns is small, the patterns are distributed densely, and a width of an etched opening in this region is small; when the spacing between adjacent elongated patterns is large, the patterns are distributed sparsely, and the width of the etched opening in this region is large. As the etching depth increases, a renewal rate of effective reaction components in this region where the width of the etched opening is small decreases, which accordingly causes a reduction in etching rate.

Specifically, when volatile components generated by etching are discharged from deep trenches and sufficient effective reaction components are allowed to enter the deep trenches to supplement the consumed part, the etching proceeds smoothly. However, as the etching depth increases, when the width of the etched opening is small, a discharge rate of the volatile components and the renewal rate of the effective reactive components get slow and thus the etching rate decreases. The etching depth of the region where the patterns are distributed densely is less than that of the region where the patterns are distributed sparsely.

In this embodiment, the substrate 100 is etched by dry etching, and after the substrate 100 is etched, the first mask layer 101 is removed (see FIG. 2), and then the active region 106 is formed.

Figure 13:
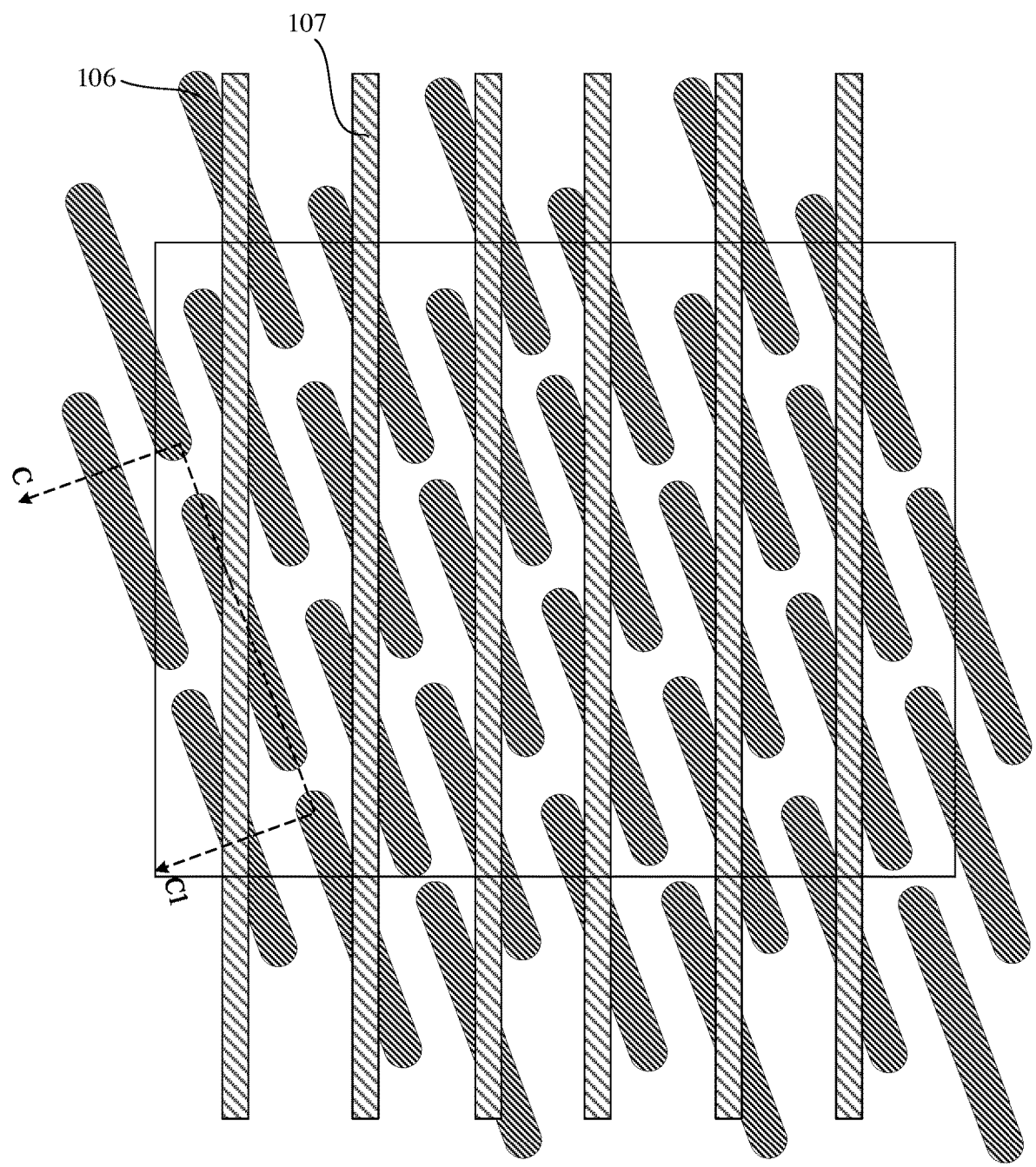
FIG. 13 is a schematic structural top view of an active region having bitlines and a sacrificial layer formed thereon according to an embodiment of the present disclosure.
Figure 14:
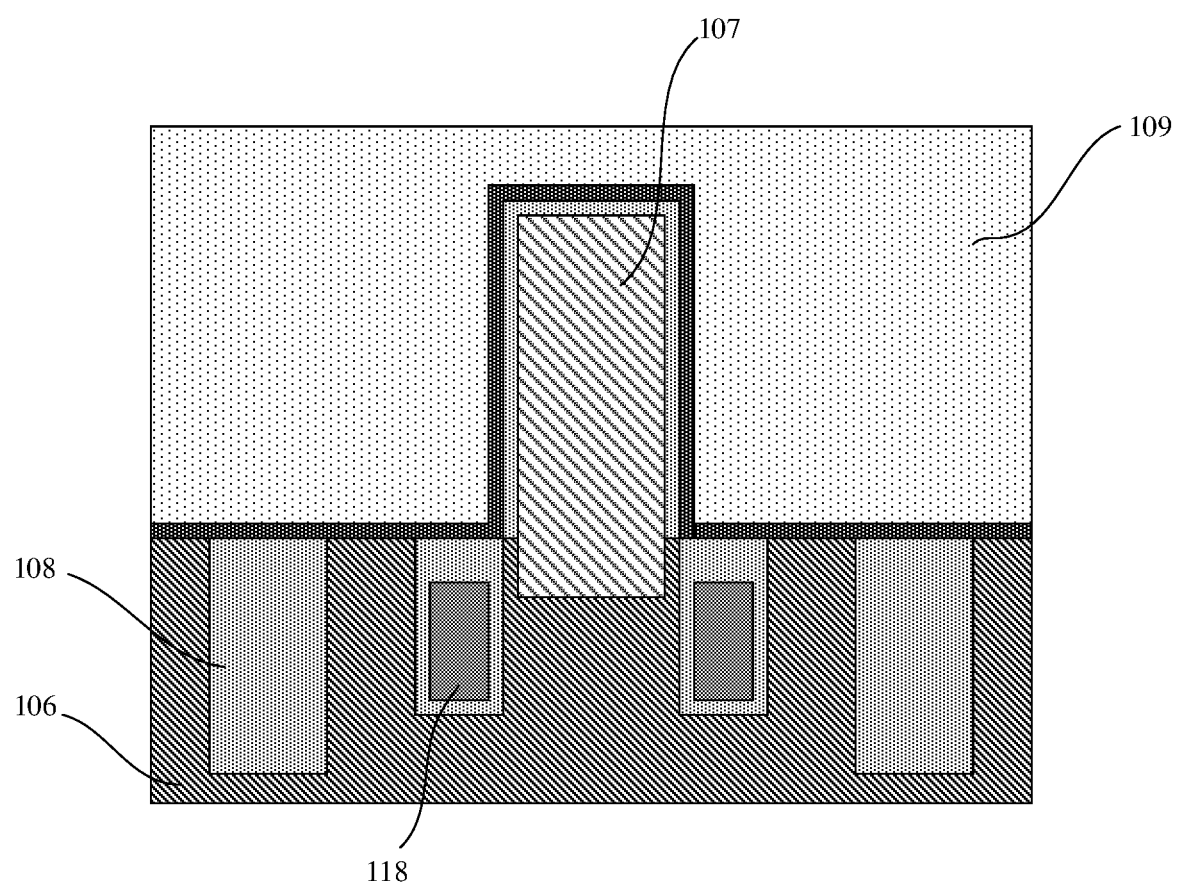
FIG. 14 is a schematic structural partial cross-sectional diagram of FIG. 13 along direction CC1.

FIGS. 13 and 14, FIG. 13 is a schematic structural top view of an active region having bitlines and a sacrificial layer formed thereon, and FIG. 14 is a schematic structural partial cross-sectional diagram of FIG. 13 along direction CC1. Several discrete bitlines 107 are formed on the active region 106.

In this embodiment, before the bitlines 107 are formed, isolation structures 118 and wordlines 128 are further formed in the active region 106. In this embodiment, the formed bitline 107 includes a cap layer 117, a sidewall protection layer 127, and a bitline conductive layer 137. The cap layer 117 is located at the top of the bitline 107 and the cap layer 117 and the subsequently formed sacrificial layer have etch selectivity. Therefore, when the elongated opening in the second mask layer 109 is subsequently used to etch the cap layer 117 and the sacrificial layer right below the elongated opening, the sacrificial layer 1 can be selectively etched to form contact hole structures. In this way, it can be ensured that two contact hole structures on both sides of the same bitline 107 can be formed corresponding to one elongated opening. Further, the cap layer 117 can also be located on the sidewalls of the bitline 107 and the surface of the active region 106. When the contact hole structure 40 is subsequently formed, the cap layer 117 on the surface of the active region 106 needs to be removed so that the formed contact structure can come into direct contact with the active region 106.

Referring to FIG. 14, a sacrificial layer 108 is formed between adjacent bitlines 107.

In this embodiment, a material of the sacrificial layer 108 includes silicon dioxide, and the sacrificial layer 108 is also located above the bitline 107. In other embodiments, the top of the sacrificial layer can also be flush with the top of the bitline.

Figure 15:
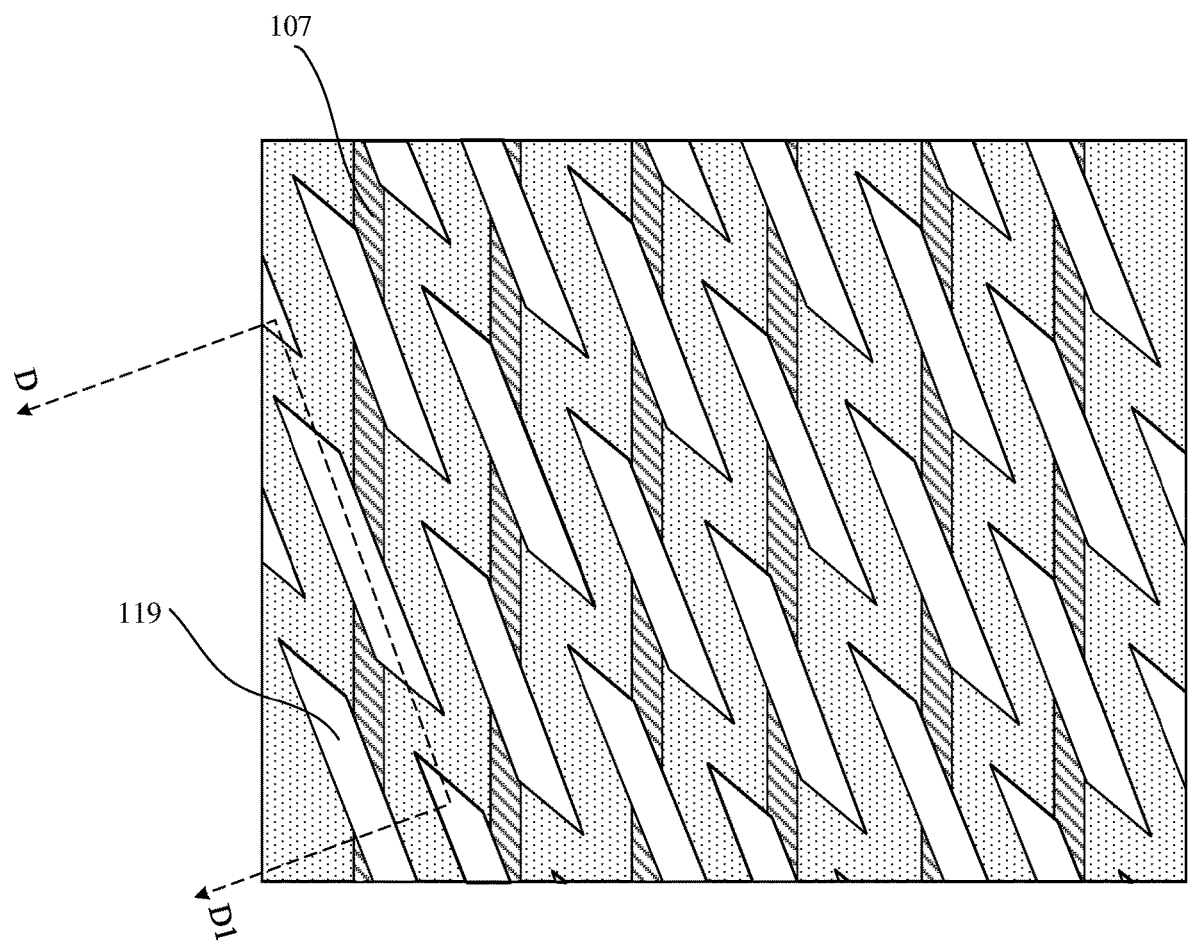
FIG. 15 is a schematic structural top view of a sacrificial layer with a second mask layer according to an embodiment of the present disclosure.
Figure 16:
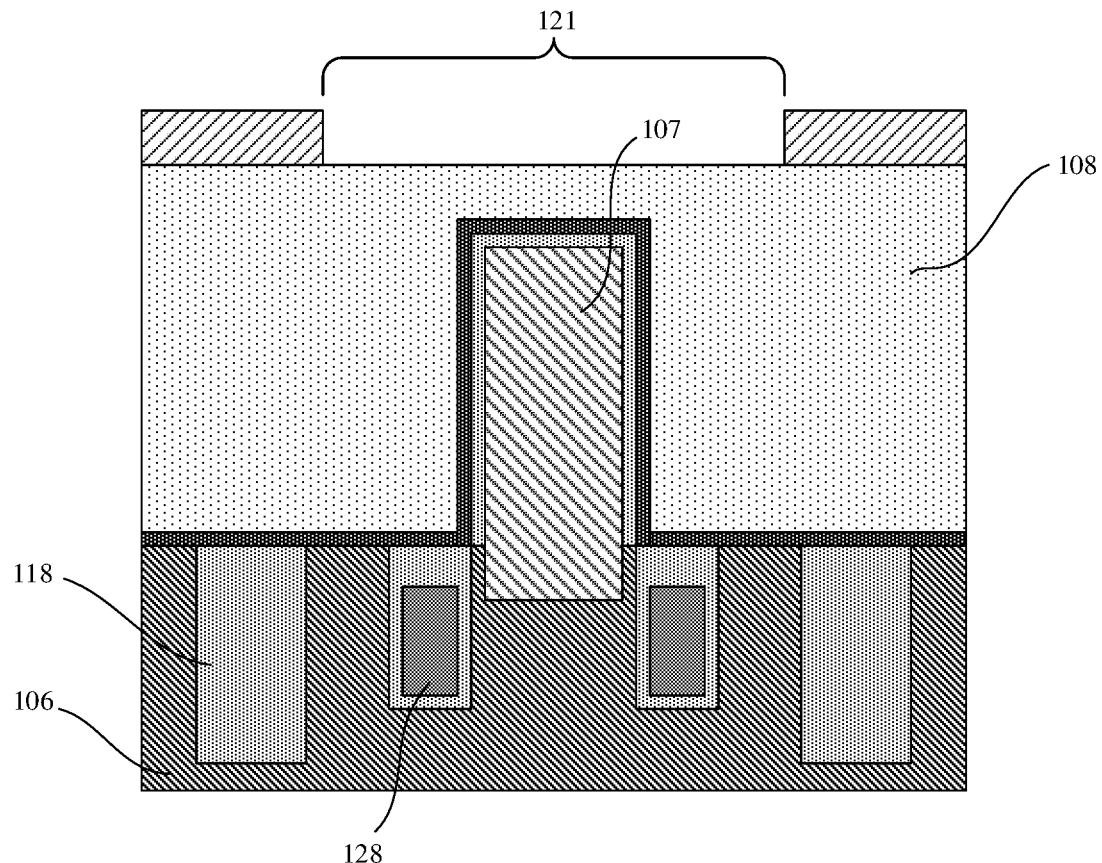
FIG. 16 is a schematic structural partial cross-sectional diagram of FIG. 15 along direction DD1.

Referring to FIGS. 15 and 16, FIG. 15 is a schematic structural top view of a sacrificial layer with a second mask layer, and FIG. 16 is a schematic structural partial cross-sectional diagram of FIG. 15 along direction DD1. A second mask layer 109 having a second mask pattern 119 is formed on the sacrificial layer 108, and the first mask pattern 111 (see FIG. 3) and the second mask pattern 119 are complementary to each other. Specifically, the first mask pattern 111 and the second mask pattern 119 are approximately the same in size and shape but opposite in nature. For example, the first mask pattern 111 is a mask remaining after the first mask layer 101 is etched, and the second mask pattern 119 is an opening formed by etching the second mask layer 109.

The second mask pattern 119 is used to define the pattern and position of the contact hole structure formed subsequently. Specifically, in this embodiment, the second mask pattern 119 includes a plurality of elongated openings which are arranged in an array. In the subsequent process step of forming the contact hole structure, the sacrificial layer 108 right below the elongated opening is etched, while the sacrificial layer 108 right below a region between adjacent elongated openings will not be etched, thus forming a plurality of contact hole structure corresponding to the active regions.

The elongated pattern (see FIG. 3) and the elongated opening are the same in size and shape, and projections of the elongated pattern and the elongated opening on the substrate 100 (see FIG. 1) are coincided. In this embodiment, the projections of the elongated pattern and the elongated opening on the substrate 100 (see FIG. 1) are both orthographic projections.

In this embodiment, the first photomask and the second photomask are further used to form the second mask pattern. The step of forming the second mask pattern will be described in detail below in conjunction with the drawings.

FIGS. 17 to 23 are schematic structural diagrams corresponding to various steps of forming the second mask pattern by using the first photomask and the second photomask according to this embodiment.

Figure 17:
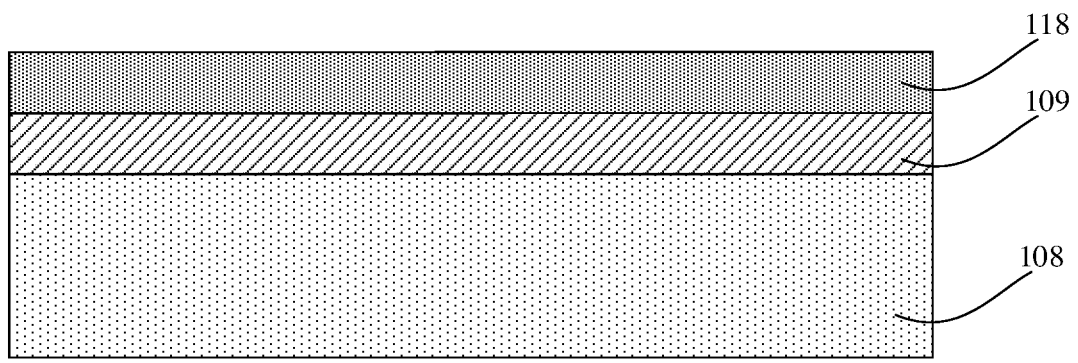
FIGS. 17 and 23 are schematic structural top views corresponding to various steps of forming a second mask pattern by using a first photomask and a second photomask according to an embodiment of the present disclosure.

Referring to FIG. 17, an unpatterned second mask layer 109 is formed on the sacrificial layer 108.

Specifically, the second mask layer 109 is located on the sacrificial layer 108 and is configured to provide a process basis for subsequent formation of a patterned second mask layer. In addition, a material of the second mask layer 109 may be a hard mask material such as silicon oxide, silicon nitride, or titanium nitride.

In order to form the second mask layer 109 having the second mask pattern 119, in this embodiment, a third mask layer 118 is further formed on the second mask layer 109, and the third mask layer 118 is made of a different material from the second mask layer 109.

Figure 18:
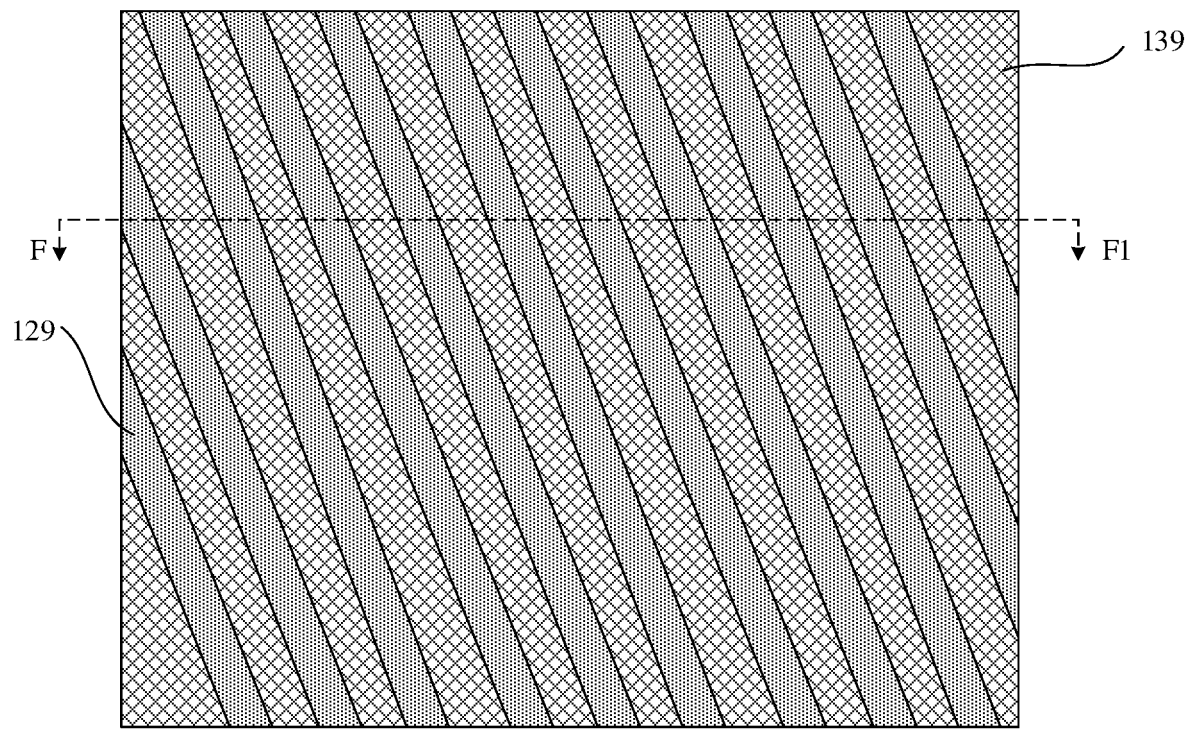
Figure 19:
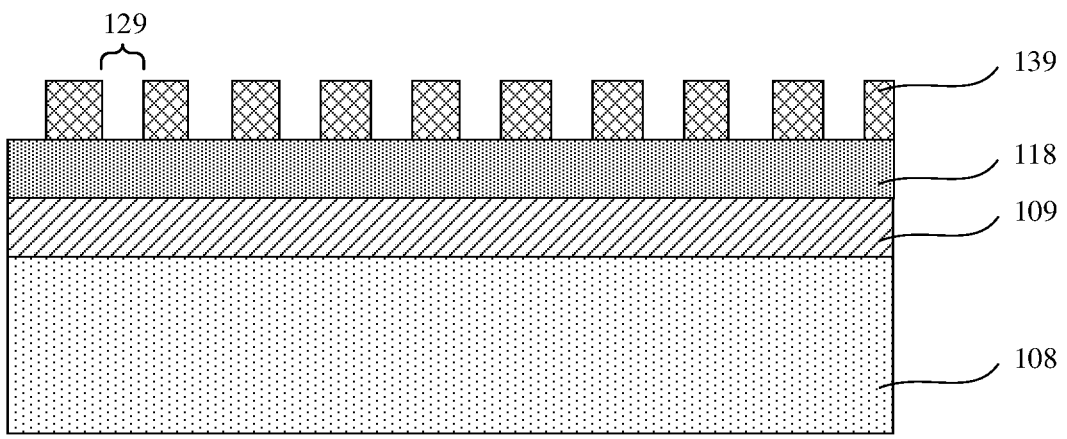

Referring to FIGS. 18 and 19, FIG. 18 is a schematic structural top view of a fourth mask layer having first photoresist openings, and FIG. 19 is a schematic structural cross-sectional diagram of FIG. 18 along direction FF1. A first photomask 2 (see FIG. 5) is provided and the first photomask 2 is configured to form first photoresist openings 129 extending in the first direction on the third mask layer 118.

The first photomask 2 includes a first light-shielding region 21 and a first transparent region 22. In this embodiment, since the nature of the photoresist forming the first photoresist line 103 (see FIG. 6) is different from the nature of the photoresist forming the first photoresist opening 129, the first photoresist opening 129 and the first photoresist line 103 are at the same position parallel to the surface of the substrate.

Specifically, the first photoresist opening 129 is located in a photoresist 139. In this embodiment, the aforementioned first photoresist line is made of a positive photoresist, and correspondingly, the photoresist 139 forming the first photoresist opening 129 is a negative photoresist.

The step of forming the first photoresist opening 129 includes: forming a covering photoresist 139, the photoresist 139 having an exposed region and a non-exposed region; exposing the photoresist 139 by using the first photomask 2, the first transparent region 22 corresponding to the exposed region, the first light-shielding region 21 corresponding to the non-exposed region, the material nature of the photoresist 139 in the exposed region being changed during the exposure process; and after the exposure process, carrying out a development process to remove the photoresist 139 in the non-exposed region, that is, removing the photoresist 139 corresponding to the first light-shielding region 21 to form the first photoresist opening 129.

It should be noted that in other embodiments, the photoresist forming the first photoresist line may be a negative photoresist, and the photoresist forming the first photoresist opening is correspondingly a positive photoresist.

Figure 20:
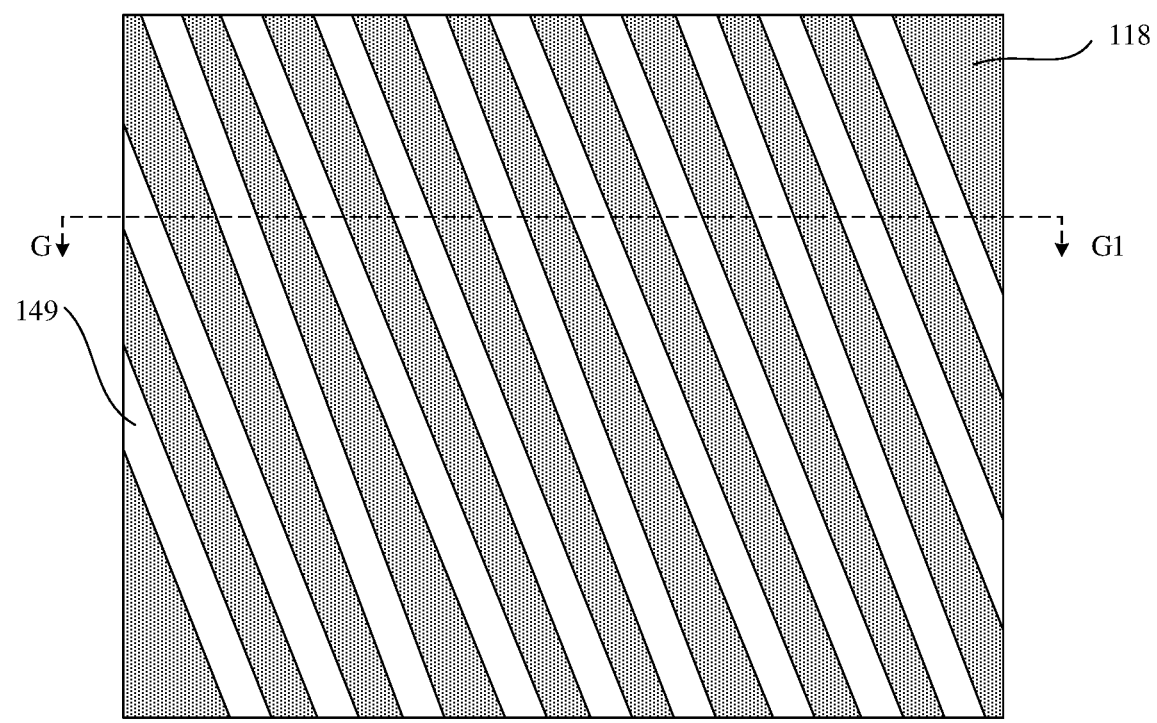
Figure 21:
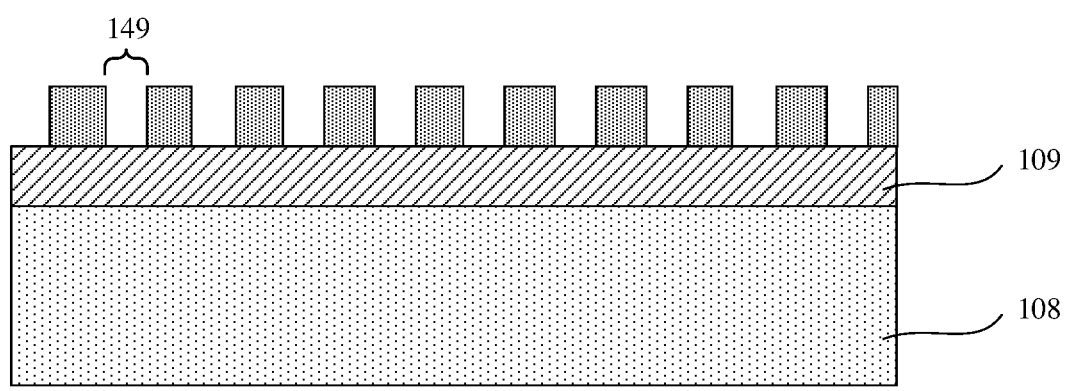

Referring to FIGS. 20 and 21, FIG. 20 is a schematic structural top view of an etched third mask layer, and FIG. 21 is a schematic structural cross-sectional diagram of FIG. 20 along direction GG1. The third mask layer 118 is etched by using the first photoresist openings 129 to form first mask openings 149.

In this embodiment, the process step of forming the first mask opening 149 includes: etching the third mask layer 118 by using the photoresist 139 forming the first photoresist opening 129 as a mask, so that the first mask openings 149 are formed in the third mask layer 118.

In this embodiment, the first mask opening 149 and the aforementioned first photoresist line 103 (see FIG. 6) are both opposite to the first light-shielding region 21, so the first mask opening 149 and the first photoresist line 103 are the same in size and shape, and projections of the first mask opening 149 and the first photoresist line 103 on the substrate 100 (see FIG. 1) are coincided. In this embodiment, the projections of the first mask opening 149 and the first photoresist line 103 on the substrate 100 (see FIG. 1) are both orthographic projections.

Figure 22:
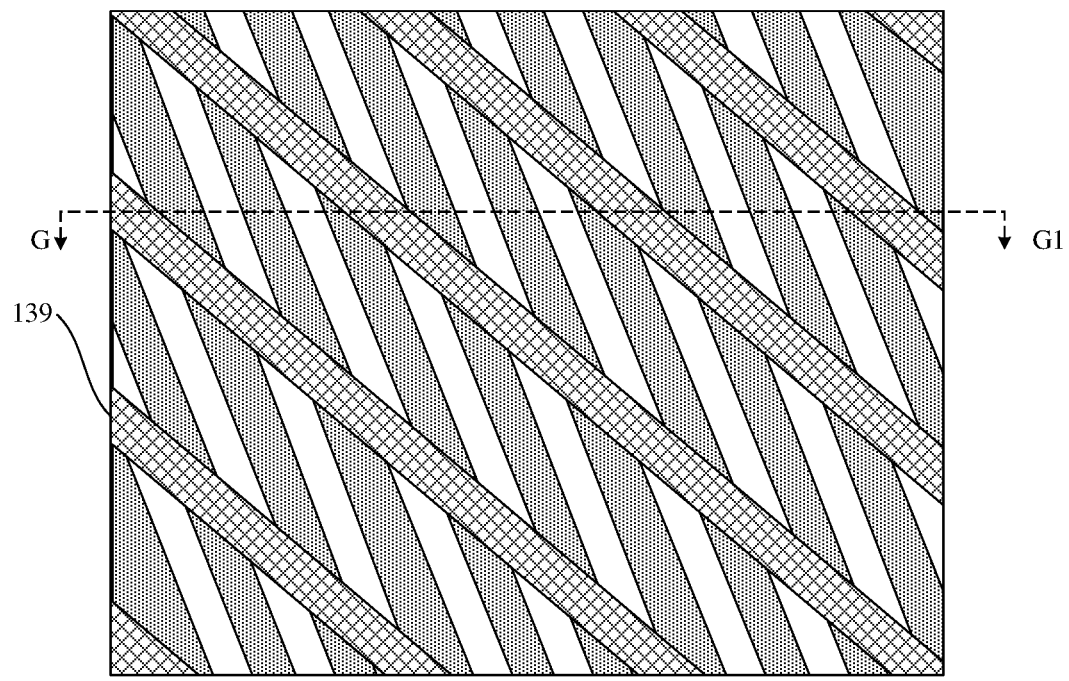
Figure 23:
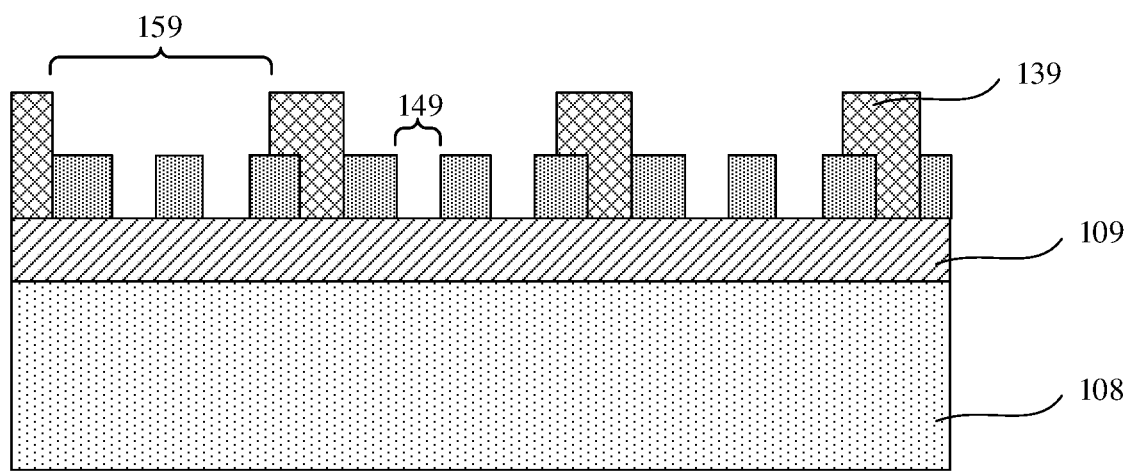

Referring to FIGS. 22 and 23, FIG. 22 is a schematic structural top view of first mask openings having second photoresist openings, and FIG. 23 is a schematic structural cross-sectional diagram of FIG. 22 along direction GG1. A second photomask 3 is provided and the second photomask 3 is configured to form second photoresist openings 159 extending in a second direction on the first mask openings 149.

The second photomask 3 includes a second light-shielding region 31 and a second transparent region 32.

In this embodiment, the nature of the photoresist forming the second photoresist line 104 (see FIG. 10) is different from the nature of the photoresist forming the second photoresist opening 159. Specifically, in this embodiment, the photoresist forming the second photoresist line 104 is a positive photoresist, and the photoresist forming the second photoresist opening 159 is a negative photoresist.

The step of forming the second photoresist opening includes: forming a covering photoresist 139, the photoresist 139 having an exposed region and a non-exposed region; exposing the photoresist 139 by using the second photomask 3, the second transparent region 32 corresponding to the exposed region, the second light-shielding region 31 corresponding to the non-exposed region, the material nature of the photoresist 139 in the exposed region being changed during the exposure process; and after the exposure process, carrying out a development process to remove the photoresist 139 in the non-exposed region, that is, removing the photoresist 139 corresponding to the second light-shielding region 31 to form the second photoresist opening 159.

It should be noted that in other embodiments, the photoresist forming the second photoresist line may be a negative photoresist, and the photoresist forming the second photoresist opening is correspondingly a positive photoresist.

In this embodiment, the photoresist 139 in the exposed region is also located in a partial region of the first mask openings 149; in this way, when the second mask layer 109 is subsequently etched by using the second photoresist opening 159 and the first mask opening 149 as masks, multiple sections of elongated openings can be formed, as shown in FIG. 15.

In this embodiment, the second photoresist opening 159 and the aforementioned second photoresist line 104 (see FIG. 10) are both opposite to the second light-shielding region 31, so the second photoresist opening 159 and the second photoresist line 104 are the same in size and shape, and projections of the second photoresist opening 159 and the second photoresist line 104 on the substrate 100 (see FIG. 1) are coincided. In this embodiment, the projections of the second photoresist opening 159 and the second photoresist line 104 on the substrate 100 (see FIG. 1) are both orthographic projections.

Referring to FIG. 16 and FIG. 23, the second mask layer 109 is etched by using the second photoresist opening 159 and the first mask opening 149 to form elongated openings.

Specifically, when the second mask layer 109 is etched with a combined pattern of the second photoresist opening 159 and the first mask opening 149 as a mask, the opening at the position where the second photoresist opening 159 and the first mask opening 149 overlap exposes the second mask layer 109 right below the opening, and the second mask layer 109 there is etched away, thus forming the elongated opening as shown in FIG. 15.

In this embodiment, the first mask opening 149 and the first photoresist line 103 are the same in size and shape, and the projections of the first mask opening 149 and the first photoresist line 103 on the substrate 100 (see FIG. 1) are coincided; moreover, the second photoresist opening 159 and the second photoresist line 104 are the same in size and shape, and the projections of the second photoresist opening 159 and the second photoresist line 104 on the substrate 100 (see FIG. 1) are coincided; therefore, the subsequently formed elongated pattern and elongated opening are the same in size and shape, and the projections of the elongated pattern and the elongated opening on the substrate 100 (see FIG. 1) are coincided.

In this embodiment, the sidewall of the elongated pattern has the repair layer 105 (see FIG. 11). When the first mask layer 101 (see FIG. 2) with the repair layer 105 (see FIG. 11) is used as a mask for etching the substrate 100 (see FIG. 1) to form the active region 106 (see FIG. 13), a pattern size of the active region 106 (see FIG. 13) is greater than the size of the elongated opening, but a projection of the active region 106 (see FIG. 13) on the substrate 100 (see FIG. 1) completely covers the projection of the elongated opening on the substrate 100 (see FIG. 1), which facilitates alignment between the subsequently formed contact hole structure and the active region 106 (see FIG. 13).

Figure 24:
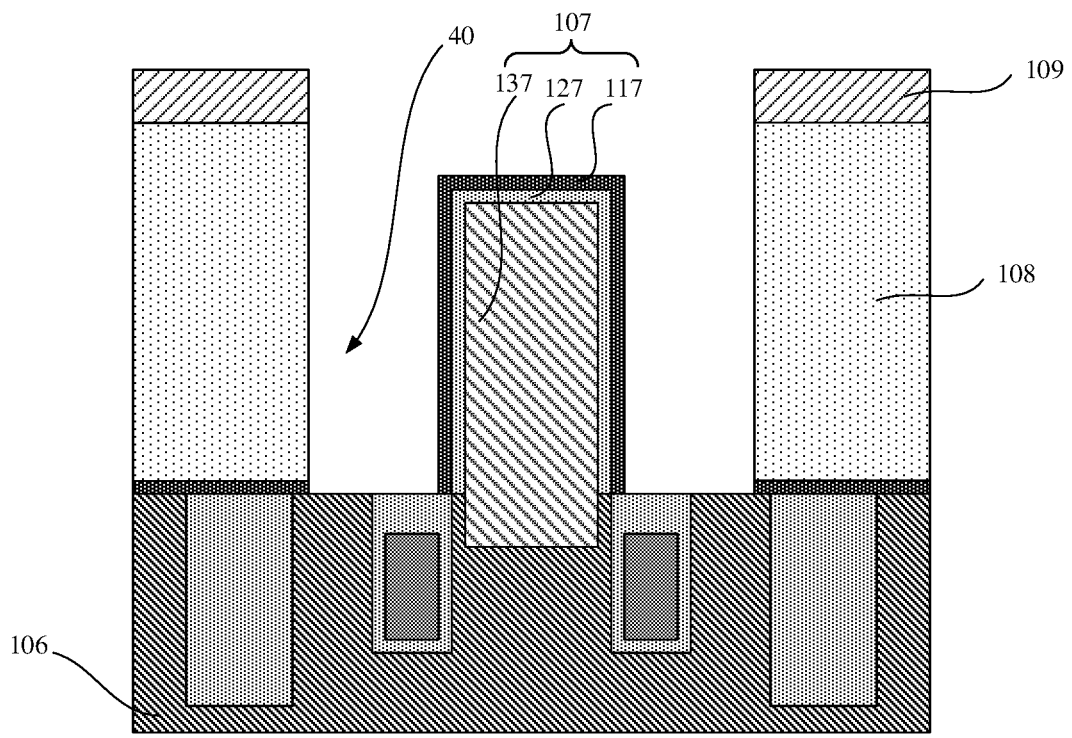
FIG. 24 is a schematic structural cross-sectional diagram of forming contact hole structures according to an embodiment of the present disclosure.

Referring to FIGS. 16 and 24, the sacrificial layer 108 is etched by using the second mask layer 109 and the bitline 107 as masks to form a plurality of contact hole structures 40.

In this embodiment, the sacrificial layer 108 is etched by dry etching, and all the sacrificial layer 108 right below the elongated opening is etched away to form the contact hole structure 40.

In this embodiment, the first mask layer 101 having the first mask pattern 111 is prepared by using the first photomask 2 and the second photomask 3, and the active region 106 of the semiconductor structure is prepared by using the first mask layer 101; the first photomask 2 and the second photomask 3 are used again to prepare the second mask layer 109 having the second mask pattern 119, and the second mask layer 109 is used to prepare the contact hole structure 40 of the semiconductor structure. In this way, the number of photomasks required for preparing the active region 106 and the contact hole structure 40 in the semiconductor structure is reduced, thereby reducing the manufacturing cost of the semiconductor structure.

In addition, since the first mask pattern 111 and the second mask pattern 119 are complementary to each other, that is, the subsequently formed elongated pattern and elongated opening are the same in shape and size, and the projections of the elongated pattern and the elongated opening on the substrate 100 (see FIG. 1) are coincided, which facilitates alignment between the subsequently formed active region 106 and the contact hole structure 40. In addition, two contact hole structures 40 on both sides of the same bitline 107 can be formed corresponding to one elongated opening in the second mask layer 109.

In other embodiments, the size of the second mask pattern 119 is greater than that of the first mask pattern 111, so that the projection of the second mask pattern 119 on the substrate 100 completely covers the projection of the first mask pattern 111 on the substrate 100, thereby increasing the opening size of the subsequently formed contact hole structure 40; in this way, the contact area between the contact structure and the active region 106 is increased, and moreover a process window for forming the contact structure is also increased. Specifically, fine-tuning the photolithography process or etching process conditions, such as increasing the exposure energy and prolonging the etching time, can adjust the size of the second mask pattern 119 so that the size of the second mask pattern 119 is slightly greater than that of the first mask pattern 111.

In other embodiments, an inclined angle between an extension direction of the second mask pattern 119 and an extension direction of the first mask pattern 111 is less than 30 degrees. By adjusting rotation angles of the first photomask and the second photomask during exposure, the inclined angle formed between the extension direction of the second mask pattern 119 and the extension direction of the first mask pattern 111 can be adjusted, so that the position of the subsequently formed contact hole structure 40 on the active region 106 can be adjusted, which further increases the flexibility of the process.

In other embodiments, the first mask pattern 111 and the second mask pattern 109 may also be formed by an SADP (Self-aligned Double Patterning) process and a Reverse-SADP process. For example, the first mask pattern 111 is etched by overlapping a first mask pattern I formed by the Reverse-SADP process and a second mask pattern II formed by the Reverse-SADP process; the second mask pattern 109 is etched by overlapping a second mask pattern I formed by the SADP process and a second mask pattern II formed by the SADP process; a photomask for forming the first mask pattern I and a photomask for forming the second mask pattern I are the same, and a photomask for forming the first mask pattern II and a photomask for forming the second mask pattern II are the same.

In this embodiment, the bitline 107 includes the cap layer 117, The cap layer 117 is located on the top of the bitline 107, and the cap layer 117 and the sacrificial layer 108 have etch selectivity; therefore, when the elongated opening in the second mask layer 109 is used to etch the cap layer 117 and the sacrificial layer 108 right below the elongated opening, the sacrificial layer 108 can be selectively etched to form contact hole structures 40. In this way, it can be ensured that two contact hole structures 40 on both sides of the same bitline 107 can be formed corresponding to one elongated opening.

Figure 25:
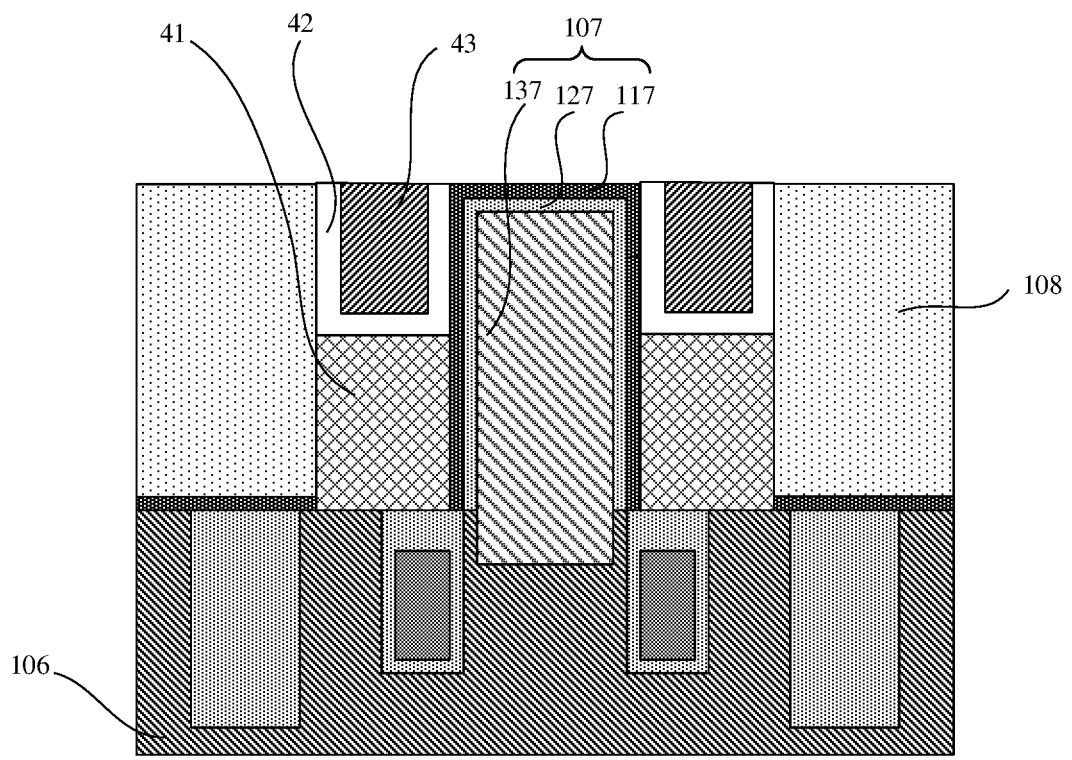
FIG. 25 is a schematic cross-sectional structure diagram of forming contact structures according to an embodiment of the present disclosure.

Referring to FIG. 25, in this embodiment, a first initial conductive layer is filled in the above-mentioned contact hole structure, the initial conductive layer fills up the contact hole structure, and a top of the first initial conductive layer is flush with the top of the sacrificial layer 108; the sacrificial layer 108 and the first conductive layer are is mechanically polished so that the top of the sacrificial layer 108 and the top of the first conductive layer are flush with the cap layer 117; the first initial conductive layer is etched to form the first conductive layer 41; a diffusion barrier layer 42 and a second conductive layer 43 are sequentially formed on the first conductive layer 41 to form a contact structure.

In this embodiment, a material of the first conductive layer includes polysilicon, a material of the diffusion barrier layer includes titanium nitride, and a material of the second conductive layer includes tungsten.

The ordinary skills in the art can understand that the implementations described above are specific embodiments for implementing the present disclosure. In practical uses, various changes in forms and details may be made to the implementations without departing from the spirit and scope of the present disclosure. Any person skilled in the art may make their own changes and modifications without departing from the spirit and scope of the present disclosure. Therefore, the protection scope of the present disclosure shall be subject to the protection scope of the claims.

What is claimed is:

1. A manufacturing method of a semiconductor structure, comprising:
    providing a substrate;
    forming a first mask layer having a first mask pattern on the substrate, and etching the substrate by using the first mask layer as a mask to form active regions;
    forming a plurality of discrete bitlines on the active regions;
    forming a sacrificial layer between adjacent bitlines;
    forming a second mask layer having a second mask pattern on the sacrificial layer, the first mask pattern and the second mask pattern being complementary to each other; and
    etching the sacrificial layer by using the second mask layer and the bitlines as masks to form a plurality of contact hole structures.

2. The manufacturing method of a semiconductor structure according to claim 1, wherein a first photomask for forming the first mask pattern and a second photomask for forming the second mask pattern are the same.

3. The manufacturing method of a semiconductor structure according to claim 2, wherein the first mask pattern comprises elongated patterns, and the second mask pattern comprises elongated openings.

4. The manufacturing method of a semiconductor structure according to claim 3, wherein the elongated patterns and the elongated openings are arranged in an array.

5. The manufacturing method of a semiconductor structure according to claim 4, wherein the elongated pattern and the elongated opening are the same in size and shape.

6. The manufacturing method of a semiconductor structure according to claim 4, wherein projections of the elongated pattern and the elongated opening on the substrate are coincided.

7. The manufacturing method of a semiconductor structure according to claim 1, wherein the bitline comprises a cap layer, the cap layer is located on top of the bitline, and the cap layer and the sacrificial layer have etch selectivity.

8. The manufacturing method of a semiconductor structure according to claim 2, wherein the first mask pattern is formed by using the first photomask and the second photomask; the second mask pattern is formed by using the first photomask and the second photomask.

9. The manufacturing method of a semiconductor structure according to claim 8, wherein the forming the first mask pattern by using the first photomask and the second photomask comprises:
    forming an unpatterned first mask layer on the substrate;
    forming a first photoresist line extending in a first direction on the first mask layer by using the first photomask;
    etching the first mask layer by using the first photoresist line to form a first mask line;
    forming a second photoresist line extending in a second direction on the first mask line by using the second photomask; and
    etching the first mask line by using the second photoresist line to form an elongated pattern.

10. The manufacturing method of a semiconductor structure according to claim 9, wherein the forming the second mask pattern by using the first photomask and the second photomask comprises:
    forming an unpatterned second mask layer on the sacrificial layer;
    forming a third mask layer on the second mask layer;
    forming a first photoresist opening extending in the first direction on the third mask layer by using the first photomask;
    etching the third mask layer by using the first photoresist opening to form a first mask opening;
    forming a second photoresist opening extending in the second direction on the first mask opening by using the second photomask; and
    etching the second mask layer by using the second photoresist opening and the first mask opening to form an elongated opening.

11. The manufacturing method of a semiconductor structure according to claim 10, wherein the nature of a photoresist forming the first photoresist line and the nature of a photoresist forming the first photoresist opening are different; the nature of a photoresist forming the second photoresist line and the nature of a photoresist forming the second photoresist opening are different are different.

12. The manufacturing method of a semiconductor structure according to claim 9, further comprising: forming a repair layer on sidewalls of the elongated pattern.

13. The manufacturing method of a semiconductor structure according to claim 2, wherein a projection of the second mask pattern on the substrate completely covers a projection of the first mask pattern on the substrate.

14. The manufacturing method of a semiconductor structure according to claim 2, wherein an inclined angle between an extension direction of the second mask pattern and an extension direction of the first mask pattern is less than 30 degrees.

15. The manufacturing method of a semiconductor structure according to claim 2, wherein the first mask pattern and the second mask pattern can be formed by one or a combination of a Self-aligned Double Patterning process and a Reverse Self-aligned Double Patterning process.

* * * * *